US010230212B1

(12) United States Patent
Ahmad et al.

(10) Patent No.: US 10,230,212 B1
(45) Date of Patent: Mar. 12, 2019

(54) METHOD AND APPARATUS TO PREVENT LASER KINK FAILURES

(71) Applicant: Cisco Technology, Inc., San Jose, CA (US)

(72) Inventors: Mudasir Ahmad, San Jose, CA (US); Weidong Xie, San Ramon, CA (US); Yaoyu Pang, Katy, TX (US); Chiyu Liu, San Diego, CA (US); Qiang Wang, Zhejiang (CN)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 15/852,475

(22) Filed: Dec. 22, 2017

(51) Int. Cl.
*H01S 5/022* (2006.01)
*H05K 1/18* (2006.01)

(52) U.S. Cl.
CPC ......... *H01S 5/02256* (2013.01); *H05K 1/181* (2013.01); *H05K 2201/068* (2013.01); *H05K 2201/09563* (2013.01); *H05K 2201/10121* (2013.01)

(58) Field of Classification Search
CPC ............... H01S 5/02256; H05K 1/181; H05K 2201/068; H05K 2201/09563; H05K 2201/10121
See application file for complete search history.

(56) References Cited

U.S. PATENT DOCUMENTS

| | | | |
|---|---|---|---|
| 8,811,445 B2 * | 8/2014 | Deri | H01S 5/02252 372/36 |
| 2016/0233142 A1 * | 8/2016 | Xu | H01L 23/3732 |

\* cited by examiner

*Primary Examiner* — Dung Nguyen
(74) *Attorney, Agent, or Firm* — Polsinelli PC

(57) ABSTRACT

Systems, devices, methods, and computer-readable media for preventing laser kink failures. A laser diode device can include one or more laser diodes configured to emit electromagnetic radiation coherently. The laser diode device can also include one or more submounts upon which the one or more laser diodes are mounted. The one or more submounts can include one or more through vias including one or more fill materials different from a material of the one or more submounts. Further, one or more properties of the one or more through vias in the one or more submounts can be selected to reduce an amount of mismatch between an effective coefficient of thermal expansion of the one or more laser diodes and an effective coefficient of thermal expansion of the one or more submounts.

19 Claims, 8 Drawing Sheets

METHOD AND APPARATUS TO PREVENT LASER KINK FAILURES

TECHNICAL FIELD

The present technology pertains to preventing laser kink failures and in particular to reducing an amount of bow that occurs in laser diodes as a result of cooling the laser diodes after mounting the diodes to a submount in order to reduce occurrences of kink failures in the diodes.

BACKGROUND

Currently, laser diodes are mounted to submounts and then cooled as part of manufacturing devices with the laser diodes. This is problematic because as the diodes and submounts are cooled, as part of bonding the diodes to the submounts, bow is created in the diodes. In particular, bow is created in the diodes as a result of differences in effective coefficients of thermal expansion between the diodes and the submounts. As a result, bow in the diodes can distort grating of the laser diodes causing phase shifting of electromagnetic radiation emitted by the diodes. Shifting phases in electromagnetic radiation output by the diodes can reduce a level of coherence of the electromagnetic radiation emitted by the diodes, thereby resulting in kink failures in the diodes. In particular, grating distortion in the laser diodes can increase a range of wavelengths of emitted electromagnetic radiation of the diodes, thereby decreasing coherence of the emitted radiation. Decreasing coherence of emitted radiation of the diodes can subsequently lead to kink failure in the diodes.

BRIEF DESCRIPTION OF THE DRAWINGS

In order to describe the manner in which the above-recited and other advantages and features of the disclosure can be obtained, a more particular description of the principles briefly described above will be rendered by reference to specific embodiments thereof which are illustrated in the appended drawings. Understanding that these drawings depict only exemplary embodiments of the disclosure and are not therefore to be considered to be limiting of its scope, the principles herein are described and explained with additional specificity and detail through the use of the accompanying drawings in which.

DESCRIPTION OF EXAMPLE EMBODIMENTS

Figure 1:
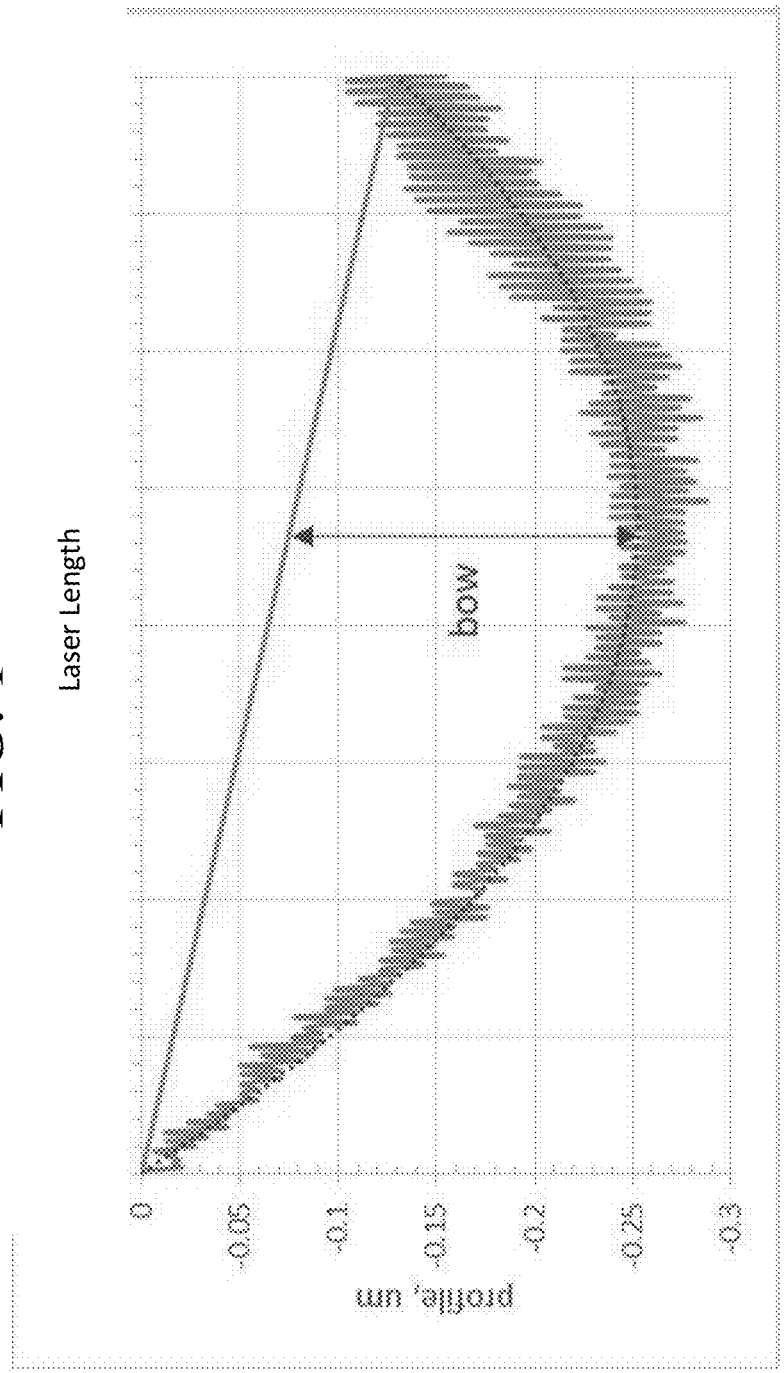
FIG. 1 shows an example topological profile illustrating bow observed in a laser diode after the manufacturing process of bonding the laser diode to a submount.

Various embodiments of the disclosure are discussed in detail below. While specific implementations are discussed, it should be understood that this is done for illustration purposes only. A person skilled in the relevant art will recognize that other components and configurations can be used without parting from the spirit and scope of the disclosure. Thus, the following description and drawings are illustrative and are not to be construed as limiting. Numerous specific details are described to provide a thorough understanding of the disclosure. However, in certain instances, well-known or conventional details are not described in order to avoid obscuring the description. References to one or an embodiment in the present disclosure can be references to the same embodiment or any embodiment; and, such references mean at least one of the embodiments.

Reference to "one embodiment" or "an embodiment" means that a particular feature, structure, or characteristic described in connection with the embodiment is included in at least one embodiment of the disclosure. The appearances of the phrase "in one embodiment" in various places in the specification are not necessarily all referring to the same embodiment, nor are separate or alternative embodiments mutually exclusive of other embodiments. Moreover, various features are described which can be exhibited by some embodiments and not by others.

The terms used in this specification generally have their ordinary meanings in the art, within the context of the disclosure, and in the specific context where each term is used. Alternative language and synonyms can be used for any one or more of the terms discussed herein, and no special significance should be placed upon whether or not a term is elaborated or discussed herein. In some cases, synonyms for certain terms are provided. A recital of one or more synonyms does not exclude the use of other synonyms. The use of examples anywhere in this specification including examples of any terms discussed herein is illustrative only, and is not intended to further limit the scope and meaning of the disclosure or of any example term. Likewise, the disclosure is not limited to various embodiments given in this specification.

Without intent to limit the scope of the disclosure, examples of instruments, apparatus, methods and their related results according to the embodiments of the present disclosure are given below. Note that titles or subtitles can be used in the examples for convenience of a reader, which in no way should limit the scope of the disclosure. Unless otherwise defined, technical and scientific terms used herein have the meaning as commonly understood by one of ordinary skill in the art to which this disclosure pertains. In the case of conflict, the present document, including definitions will control.

Additional features and advantages of the disclosure will be set forth in the description which follows, and in part will be obvious from the description, or can be learned by practice of the herein disclosed principles. The features and advantages of the disclosure can be realized and obtained by means of the instruments and combinations particularly pointed out in the appended claims. These and other features of the disclosure will become more fully apparent from the following description and appended claims, or can be learned by the practice of the principles set forth herein.

Overview

A laser diode device can include one or more laser diodes configured to emit electromagnetic radiation coherently. The laser diode device can also include one or more submounts upon which the one or more laser diodes are mounted. The one or more submounts can include one or more through vias including one or more fill materials different from a material of the one or more submounts. Further, one or more properties of the one or more through vias in the one or more submounts can be selected to reduce an amount of mismatch between an effective coefficient of thermal expansion of the one or more laser diodes and an effective coefficient of thermal expansion of the one or more submounts.

A method can include identifying one or more submounts and one or more laser diodes to mount to the one or more submounts. One or more properties of one or more through vias including one or more fill materials different from a material of the one or more submounts can be selected to reduce an amount of mismatch between an effective coefficient of thermal expansion of the one or more submounts and an effective coefficient of thermal expansion of the one or more laser diodes. The one or more submounts can be fabricated according to the one or more properties of the one or more through vias including the one or more fill materials selected to reduce the amount of mismatch between the effective coefficient of thermal expansion of the one or more laser diodes and the effective coefficient of thermal expansion of the one or more submounts. Subsequently, the one or more laser diodes can be mounted to the one or more submounts.

A method can include observing amounts of bow in a laser diode submount assembly lacking through vias in a submount of the laser diode assembly and laser diode submount assemblies with submounts including through vias with fill materials having varying through via properties. A finite element analysis model of an amount of bow in a laser diode as a function of an amount of mismatch between effective coefficients of thermal expansion of the laser diode and a submount can be developed. The model can be developed using the amounts of bow observed in the laser diode submount assembly lacking through vias in the submount of the laser diode submount assembly and the laser diode submount assemblies having the submounts with the through vias including the fill materials having the varying through via properties. Subsequently, the model can be used for selecting one or more properties of one or more through vias in one or more submounts configured to receive one or more laser diodes mounted thereon to reduce an amount of mismatch between an effective coefficient of thermal expansion of the one or more laser diodes and an effective coefficient of thermal expansion of the one or more submounts.

Example Embodiments

The disclosed technology addresses the need in the art for preventing laser diode kink failure. The present technology involves system, methods, and computer-readable media for preventing bow in laser diodes during manufacturing to prevent laser kink failure. In particular, the present technology involves systems, methods, and computer-readable media for reducing a mismatch between an effective coefficient of thermal expansion of a laser diode and an effective coefficient of thermal expansion of a submount upon which the laser diode is mounted during manufacturing in order to reduce bow in the laser diode during manufacturing, and subsequently reducing the chances of kink failure occurring in the laser diode.

The present technology will be described in the following disclosure as follows. The discussion begins with an introductory discussion of kink failure and bow in laser diodes, as shown in FIG. 1. A discussion of example systems and methods for reducing chances of kink failure being introduced during manufacturing, as illustrated in FIGS. 2-7, will then follow. A discussed of example computing devices, as illustrated in FIG. 8, will then follow. The disclosure now turns to an introductory discussion of kink failure in laser diodes.

Laser diodes have been developed to emit coherent electromagnetic radiation across a wide range of wavelengths in the electromagnetic spectrum, including both the visible and invisible spectrums. Accordingly, laser diodes are used in a wide variety of applications. For example, laser diodes can be used in fiber optic communication devices, barcode readers, laser pointers, disc readers and recorders, laser printing devices, laser scanning devices, Internet of things (herein referred to as "IoT") devices, and other applicable photonic devices.

In manufacturing laser diode subassemblies for devices and systems, the laser diodes are mounted to submounts. The submounts can be included as part of a printed circuit board that is used to provide input and power for operating the laser diodes. Typically laser diodes are bonded to submounts using a solder material. For example, an AuSn solder can be used to bond laser diodes to submounts. In typical processes of bonding laser diodes to submounts using a solder material, the solder material, e.g. solder paste, is disposed on the submounts. The laser diodes are then placed on the submounts at positions where the solder material is disposed, e.g. using a pick-and-place method. After the laser diodes are placed on the submounts, the solder material, along with both the laser diodes and the submounts, are heated in order to melt the solder material. Subsequently, the solder material, the laser diodes, and the submounts are cooled in order to re-solidify the solder material, to bond the laser diodes to the submounts.

Submounts are usually fabricated from Silicon. In particular, submounts are usually fabricated from Silicon as a result of its vast use and wide-spread adoption in the semiconductor industry. Silicon submounts used in mounting laser diodes can also incorporate other circuit components or be integrated as part of a printed circuit board incorporating other circuit components. For example, Silicon submounts can include power amplifiers mounted to the submounts that are used in amplifying power signals for laser diodes mounted to the submounts. While submounts are described herein with reference to Silicon, submounts for receiving laser diodes can be fabricated from an applicable material, e.g. AlN.

Kink failure is a common failure mode of laser diode subassemblies that is caused during the manufacturing of the laser diode subassemblies. In turn, kink failure can decrease production yields of laser diode subassemblies. For example, 8% of a total production yield of laser diodes bonded to a Si submount using AuSn solder paste can exhibit kink failure. Kink failure can be caused by warping and bending of laser diodes, otherwise referred to as bow in the laser diodes, occurring during manufacturing. More specifically, warping and bending of laser diodes can cause bending of laser grating included as part of laser diodes in a laser diode subassembly. Subsequently, bending of laser grating of laser diodes can phase shift an electromagnetic radiation output of the laser diodes resulting in kink failures in the laser diodes.

Mismatches between an effective coefficient of thermal expansion of a submount and an effective coefficient of thermal expansion of a laser diode can cause warping and bending within the laser diode during manufacture of a laser diode subassembly. An effective coefficient of thermal expansion of a submount and a laser diode, as used herein, includes an overall coefficient of thermal expansion of the submount and the laser diode based on thermal expansion coefficients of materials or parts of the submount and the laser diode. For example, if a submount includes two separate materials with different thermal expansion coefficients, then an effective coefficient of thermal expansion of the submount can be an average of the thermal expansion coefficients of the materials. An effective coefficient of thermal expansion coefficient of a laser diode and a submount can depend on volumes of different materials or parts in the submount and the laser diode. For example, if a first material in a laser diode forms 90% of the laser diode and a second material only forms 10% of the laser diode, then a coefficient of thermal expansion of the first material can contribute more greatly to an effective coefficient of the laser diode than a coefficient of thermal expansion of the second material.

Further, mismatches between an effective coefficient of thermal expansion of a submount and an effective coefficient of thermal expansion of a laser diode can cause warping and bending within the laser diode when the subassembly is cooled down during the process of mounting laser diode to the submount. More specifically, mismatches between effective coefficients of thermal expansion can lead to bow in the laser diode as the laser diode and a submount, forming at least part of a laser diode subassembly, are cooled after solder is heated as part of bonding the diode to the submount. For example, an InP laser diode, having an effective coefficient of thermal expansion of 4.6 ppm/K can be picked and placed on a Si submount having an effective coefficient of thermal expansion of 2.6 ppm/K. The laser diode subassembly can then be heated to around 280° C. during a ramp up and dwelling period to melt AuSn solder paste disposed on the submount. Subsequently, the laser diode subassembly can be cooled to room temperature during which the difference in the effective coefficients of thermal expansion between the laser diode and submount can cause bow in the laser diode. More specifically, the laser diode can shrink more than the submount during the cooling process to cause the laser diode to bow.

FIG. 1 shows an example topological profile 100 illustrating bow observed in a laser diode across a length of the laser after the manufacturing process of bonding the laser diode to a submount. The topological profile 100 shown in FIG. 1 can correspond to an InP laser diode bonded to a Silicon submount using AuSn solder paste through the previously described process of manufacturing a laser subassembly. As shown in FIG. 1, bow is observed across the entire length of the laser diode. Additionally, the greatest amount of bow, around 0.25 µm is observed towards the center of the laser diode.

Accordingly there exists a need for mechanisms and methods of reducing kink failure occurring in laser diodes as a result of manufacturing laser diode subassemblies. More specifically, there exists a need for mechanisms and methods for reducing an amount of mismatch between effective coefficients of thermal expansion of laser diodes and submounts to reduce an amount of bow in the laser diodes as a result of manufacturing laser diode subassemblies. Further, as laser diode subassemblies are typically manufactured using Silicon wafers and corresponding Silicon processing techniques, there exists a need for mechanisms and methods for reducing kink failure using Silicon wafers and corresponding Silicon processing techniques.

An amount of bow introduced in a laser diode during cooling of a laser diode subassembly can depend on dimensions of the laser diode. Specifically, as bow increases towards a center of a laser diode, e.g. as shown in FIG. 1, longer laser diodes can exhibit greater amounts of bow than shorter laser diodes. This is problematic as it can be more beneficial to utilize larger laser diodes in laser diode assemblies. For example, larger laser diodes can accumulate more power to form a beam of coherent electromagnetic radiation for use in applications that require larger electromagnetic radiation intensities. Accordingly, there further exists a need to reduce an amount of bow and subsequent chances of kink failure caused in laser diodes through laser diode subassembly fabrication.

Figure 2:
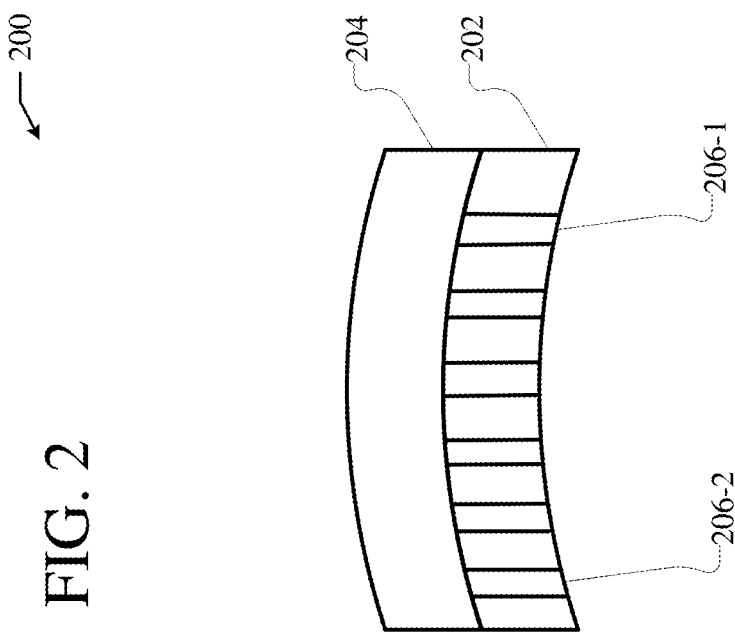
FIG. 2 depicts a cross-sectional view of a laser diode subassembly.

FIG. 2 depicts a cross-sectional view of a laser diode subassembly 200. The laser diode subassembly 200 includes a submount 202 and a laser diode 204. The laser diode 204 is secured to the submount 202 through an applicable attachment mechanism, e.g. using solder paste. Further, the laser diode 204 can be mounted to the submount 202 through an applicable manufacturing process, such as the previously described processes for mounting a laser diode to a submount as part of manufacturing a laser diode subassembly. For example, solder paste can be disposed between the submount 202 and the laser diode 204. Further in the example, the laser diode subassembly 200 can be heated and cooled to melt and solidify the solder paste in order to secure the laser diode 204 to the submount 202.

The laser diode subassembly 200 includes a first though via 206-1 and a second through via 206-2 (herein referred to as "through vias 206"). While multiple through vias 206 are shown in the submount 202 of the example laser subassembly 200 shown in FIG. 2, in certain embodiments the submount 202 can include only a single through via. The through vias 206 are configured to reduce a mismatch between an effective coefficient of thermal expansion of the submount and an effective coefficient of thermal expansion of the laser diode 204. Reduction of a mismatch between effective coefficients of thermal expansion, as user herein, is made with reference to a laser diode subassembly including a submount that lacks through vias. Specifically, the through vias 206 can reduce a mismatch between effective coefficients of thermal expansion of the submount 202 and the laser diode 204 in comparison to a laser diode subassembly with a submount lacking through vias.

In reducing a mismatch between effective coefficients of thermal expansion of the submount 202 and the laser diode 204, the through vias 206 can reduce chances of kink failure occurring during manufacturing of the laser diode subassembly 200. Further, in reducing mismatches in effective coefficient of thermal expansion, the through vias 206 can reduce an amount of warping and subsequent bow in the laser diode 204 created during manufacturing of the laser diode subassembly 200. More specifically, the through vias 206 can reduce an amount of warping that occurs in the laser diode 204 when the laser diode subassembly 200 is cooled as part of mounting the laser diode 204 to the submount 202 to manufacture the laser diode subassembly 200.

The through vias 206 can include one or more fill or filler materials. The one or more filler materials can act, along with the through vias 206, to reduce a mismatch between an effective coefficient of thermal expansion of the submount 202 and an effective coefficient of thermal expansion of the laser diode 204. In turn, the one or more filler materials can act, along with the through vias 206, to reduce changes of kink failure occurring in the laser diode subassembly 200 as a result of manufacturing the laser diode subassembly 200.

One or more filler materials disposed in the through vias 206 can include materials that are different from materials of a substrate forming the submount 202. Further, the one or more filler materials can increase an effective coefficient of thermal expansion of the submount 202 in order to reduce a mismatch with an effective coefficient of thermal expansion of the laser diode 204. More specifically, the one or more filler materials can have a coefficient of thermal expansion greater than a substrate material of the submount 202, thereby increasing an effective coefficient of thermal expansion of the submount 202. The through vias 206, in combination with the one or more filler materials filled in the through vias 206, can be electrically non-functional. More specifically, filler materials in the through vias 206 do not have to serve as electrical connections to and from the laser diode 204.

The submount 202 can be comprised of a Silicon substrate material. In being fabricated from a Silicon substrate material, the submount 202 and the through vias 206 can be fabricated using widely used Silicon processing techniques. As Silicon processing techniques are already implemented in semiconductor fabrication factories, new processes do not have to be created and implemented to fabricate the laser diode subassemblies 200 with the through vias 206 and fill materials. In turn, the laser diode subassemblies 200 can be easily fabricated at costs similar to current fabrication costs of laser diode subassemblies.

The through vias 206 can be filled with Copper. As Copper is a widely used material in semiconductor fabrication, its integration in the laser diode subassembly 200 can allow for easy fabrication of the laser diode subassembly 200 using current semiconductor fabrication equipment and methods. By filling the through vias 206 with Copper, an effective overall coefficient of thermal expansion of the submount 202 can be increased. For example, the submount 202 can be fabricated from a Silicon substrate material having a coefficient of thermal expansion of 3 ppm/K. Further in the example, the through vias 206 can be filled with Copper which has a coefficient of thermal expansion of 17 ppm/K. Accordingly the Copper can serve to increase an effective coefficient of thermal expansion of the submount 202 above 3 ppm/K, in order to reduce mismatch with an effective coefficient of thermal expansion of the laser diode 204.

One or more properties of the through vias 206 can be selected to reduce an amount of mismatch between an effective coefficient of thermal expansion of the laser diode 204 and an effective coefficient of thermal expansion of the submount 202. Example, properties of the through vias 206 can include one or a combination of a number of the through vias 206, dimensions of the through vias 206, and a density of the through vias 206 in a volume of the submount 202. For example, a density of the through vias 206 in the submount 202 can be selected in order to match an effective coefficient of thermal expansion of the submount 202 with an effective coefficient of thermal expansion of the laser diode 204. Further, properties of the through vias 206 can include properties of fill materials in the through vias 206. Example properties of fill materials in the through vias 206 can include a type of fill material in the through vias 206, an amount of fill material in the through vias 206, and which specific through vias 206 include a fill material. For example, the through vias 206 can be filled with a material with a thermal expansion coefficient to increase an effective thermal expansion coefficient of the submount 202.

Additionally, one or more properties of the through vias 206 can include positions of the through vias 206 in the submount 202 with respect to a position on the submount 202 at which the laser diode 204 is mounted. More specifically, positions of the through vias 206 in the submount 202 with respect to a position on the submount of the laser diode 204 can be selected to reduce mismatches in effective thermal expansion coefficients between the submount 202 and the laser diode 204. For example, the through vias 206 can be disposed within the submount 202 in proximity to the laser diode 204 in order to reduce mismatches in effective coefficient of thermal expansion between the laser diode 204 and the submount 202.

Properties of the through vias 206 can be selected to reduce an amount of mismatch between effective coefficients of thermal expansion using a finite element analysis model. More specifically, a finite element analysis model can be developed and subsequently used to tune or otherwise reduce a mismatch between effective coefficients of thermal expansion of the submount 202 and the laser diode 204. For example, a finite element analysis model of an amount of bow in a laser diode as a function of an amount of mismatch between effective coefficients of thermal expansion of a laser diode and a submount can be created, as will be discussed in greater detail later. Subsequently, the finite element analysis model can be used to select properties of the through vias 206, potentially including properties of one or more filler materials disposed in the through vias 206, for reducing an amount of mismatch between effective coefficients of thermal expansion of the submount 202 and the laser diode 204.

Properties of the through vias 206 can be selected based on characteristics of the laser diode 204. More specifically, properties of the through vias 206 can be selected based on characteristics of the laser diode 204 in order to reduce an amount of mismatch between effective coefficients of thermal expansion of the submount 202 and the laser diode 204. Examples of characteristics of the laser diode 204 used to select properties of the through vias 206 can include dimensions of the laser diode 204, materials used in fabricating the laser diode 204, and an effective coefficient of thermal expansion of the laser diode 204. For example, a number of through vias 206 disposed in the submount 202 can be added as a function of a length of the laser diode 204. Further, properties of the through vias 206 can be selected based on characteristics of the laser diode 204 using a using a finite element analysis model. For example, a finite element analysis model can be applied according to an effective coefficient of thermal expansion of the laser diode 204 in order to select properties of the through vias 206.

Additionally, properties of the through vias 206 can be selected based on characteristics of a material used to bond the laser diode 204 to the submount 202. More specifically, properties of the through vias 206 can be selected based on characteristics of a material used to bond the laser diode 204 to the submount 202 in order to reduce an amount of mismatch between effective coefficients of thermal expansion of the submount 202 and the laser diode 204. Examples of characteristics of a material used to bond the laser diode 204 to the submount 202 can include material properties of the material, an amount of the material used to bond the laser diode 204 to the submount 202, and position on the submount 202 where the material is disposed. For example, a number of through vias 206 disposed in the submount 202 can be added as a function of a thickness of solder paste used to bond the laser diode 204 to the submount 202. Further, properties of the through vias 206 can be selected based on characteristics of a material used to bond the laser diode 204 to the submount 202 using a using a finite element analysis model. For example, a finite element analysis model can be applied according to a coefficient of thermal expansion of solder paste used in bonding the laser diode 204 to the submount 202 in order to select properties of the through vias 206.

Figure 3:
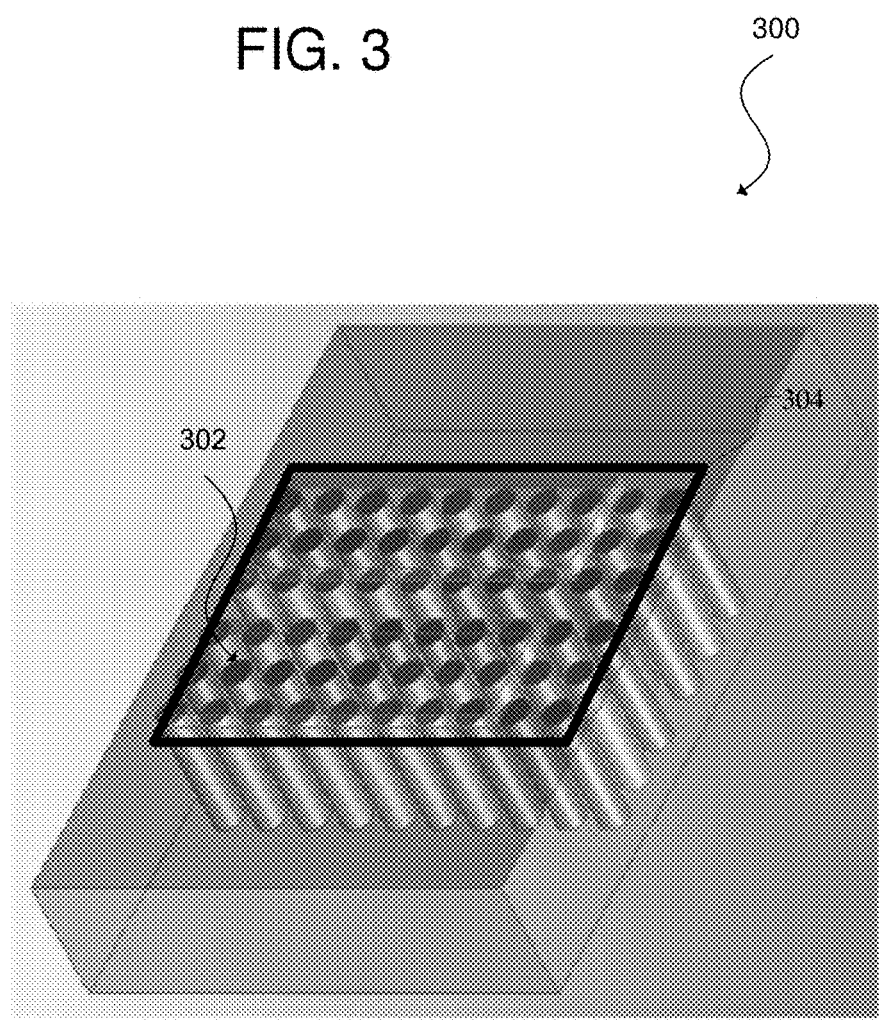
FIG. 3 shows a view of a submount.

FIG. 3 shows a view of a submount 300. The submount 300 includes a plurality of through vias 302. The through vias 302 extend though a thickness of the submount 300 and are configured to reduce an amount of mismatch between an effective coefficient of thermal expansion of the submount 300 and an effective coefficient of thermal expansion of a laser diode capable of being mounted on the submount 300. For example, the through vias 302 can raise an effective coefficient of thermal expansion of the submount 300 in order to reduce mismatch between the effective coefficient of thermal expansion of the submount 300 and a laser diode mounted on the submount 300. More specifically, by reducing the amount of mismatch between effective coefficients of thermal expansion, the through vias 302 can reduce chances that kink failure is introduced in a laser diode mounted onto the submount 300 to create a laser diode subassembly.

The submount 300 can be fabricated from an applicable substrate material. For example, the submount 300 can be fabricated from Silicon. The through vias 302 can be filled with one or more applicable fill materials. For example, the through vias 302 can be filled with Copper in order to increase an effective coefficient of thermal expansion of the submount 300.

The through vias 302 in the example submount 300 shown in FIG. 3 are not disposed throughout the entire volume of the submount 300. Instead, the through vias 302 are disposed within a specific area 304 of the submount 300. In selectively placing the through vias 302 within the specific area 304 of the submount 300, the submount 300 and the corresponding through vias 302 can be manufactured cheaper as opposed to a submount where through vias are disposed throughout an entire volume of the submount. Further, in selectively placing the through vias 302, other components can be mounted to or integrated as part of the submount 300, e.g. in area of the submount 300 lacking the through vias 302.

The specific area 304 can correspond to a position that a laser diode can or will be mounted onto the submount 300. More specifically, the specific area 304 can be a staging area of the submount 300 where a laser diode is placed and subsequently bonded to the submount 300. Accordingly, the through vias 302 can be disposed in the submount 300 with respect to a position of a laser diode mounted to the submount 300. In disposing the through vias 302 in proximity to a position where a laser diode will be mounted, the through vias 302 are closer to the bond location of the laser diode, and can thereby further reduce an amount of bow introduced in the laser diode through the process of manufacturing a laser diode subassembly.

Figure 4:
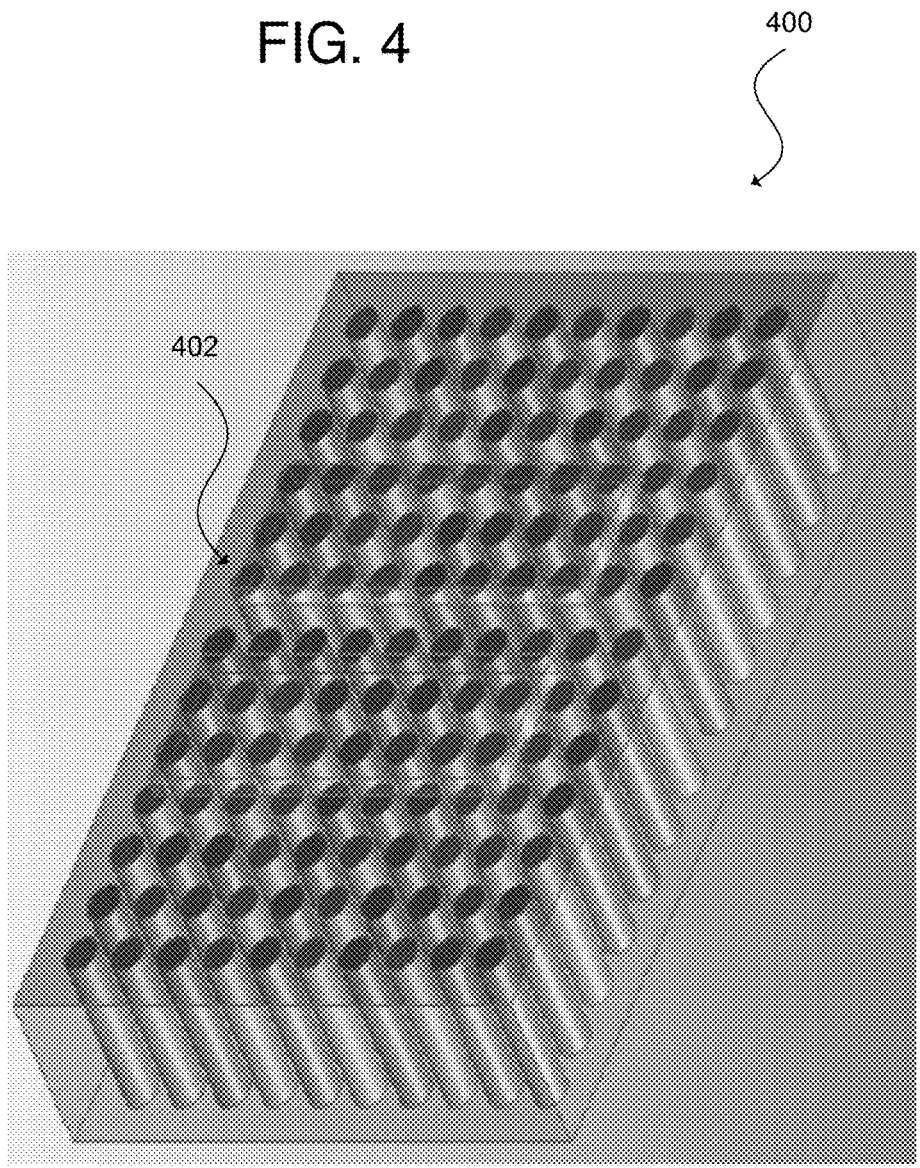
FIG. 4 shows a view of another submount.

FIG. 4 shows a view of another submount 400. The submount 400 includes a plurality of through vias 402. The through vias 402 extend though a thickness of the submount 400 and are configured to reduce an amount of mismatch between an effective coefficient of thermal expansion of the submount 400 and an effective coefficient of thermal expansion of a laser diode capable of being mounted on the submount 400. For example, the through vias 402 can raise an effective coefficient of thermal expansion of the submount 400 in order to reduce mismatch between the effective coefficient of thermal expansion of the submount 400 and a laser diode mounted on the submount 400. More specifically, by reducing the amount of mismatch between effective coefficients of thermal expansion, the through vias 402 can reduce chances that kink failure is introduced in a laser diode mounted on the submount 400 to create a laser diode subassembly.

The submount 400 can be fabricated from an applicable substrate material. For example, the submount 400 can be fabricated from Silicon. The through vias 402 can be filled with one or more applicable fill materials. For example, the through vias 402 can be filled with Copper in order to increase an effective coefficient of thermal expansion of the submount 400. The through vias 402 are disposed throughout an entire volume of the submount 400. By being disposed through an entire volume of the submount 400, the through vias 402 can ensure that a mismatch between effective coefficients of thermal expansion of the submount 400 and laser diodes mounted thereon is reduced across the entire submount 400.

Figure 5:
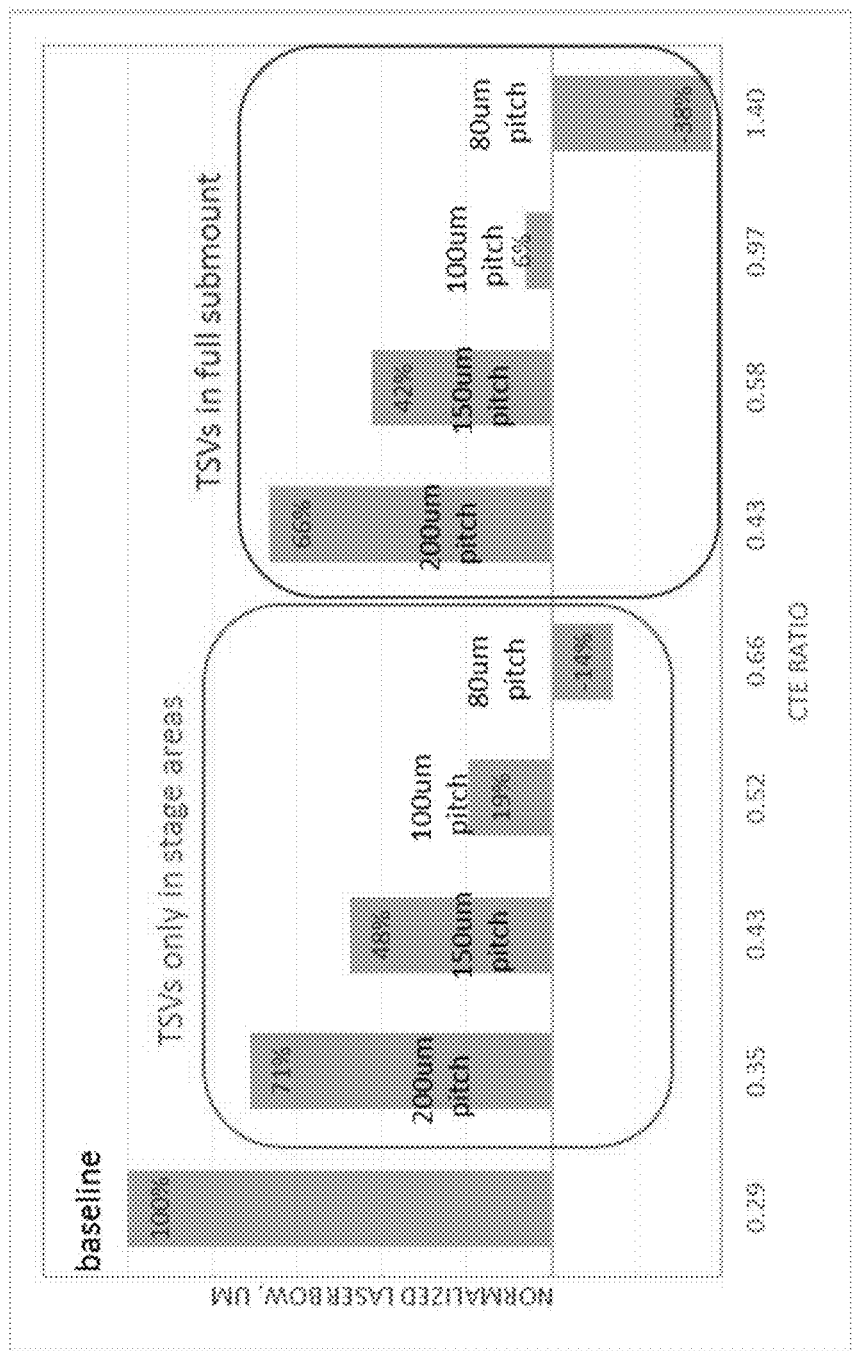
FIG. 5 shows a graph of normalized bow observed in laser diode subassemblies as a function of CTE ratio.

FIG. 5 shows a graph of normalized bow observed in laser diode subassemblies as a function of effective coefficient of thermal expansion ratio (herein referred to as "CTE ratio"). A CTE ratio includes a ratio of an effective coefficient of thermal expansion of a submount and an effective coefficient of thermal expansion of one or more laser diodes mounted thereon. The bow is normalized with respect to a baseline laser diode subassembly. The baseline laser diode subassembly can include a submount that lacks through vias. As the baseline laser diode subassembly has the greatest mismatch in effective coefficients of thermal expansion. It has the lowest CTE ratio, at 0.29, and the highest amount of bow.

Normalized bow in two sets of laser diode subassemblies is illustrated in FIG. 5. In particular the first set, called the "TSVs only in stage area" set, includes laser diode subassemblies with submounts only having through vias in proximity to laser diodes, such as the submount shown in FIG. 3. The second set, called the "TSVs in full submount" set, includes laser diode subassemblies with submounts having through vias throughout the submounts, such as the submount shown in FIG. 4.

In both sets, the through vias in the submounts are 50 µm diameter through vias. Further the CTE ratio in the sets is varied across laser diode subassemblies by varying a number of through vias, otherwise referred to as pitch. For example, the 200 µm pitch laser diode subassembly has a CTE ratio of 0.35, while the 80 µm pitch laser diode subassembly has a CTE ration of 0.66 corresponding to increase numbers of through vias per unit volume. In both sets the amount of normalized bow decreases as the CTE ratio increases until a certain point, where the laser diode actually begins to bow in the opposite direction, corresponding to negative normalized bow. Specifically, in both sets, the 80 µm pitch laser subassemblies exhibit negative normalized bow. Accordingly, there exists a CTE ratio where bow is absent from a laser diode subassembly, e.g. between the 100 µm pitch laser diode subassemblies and the 80 µm pitch laser diode subassemblies.

Figure 6:
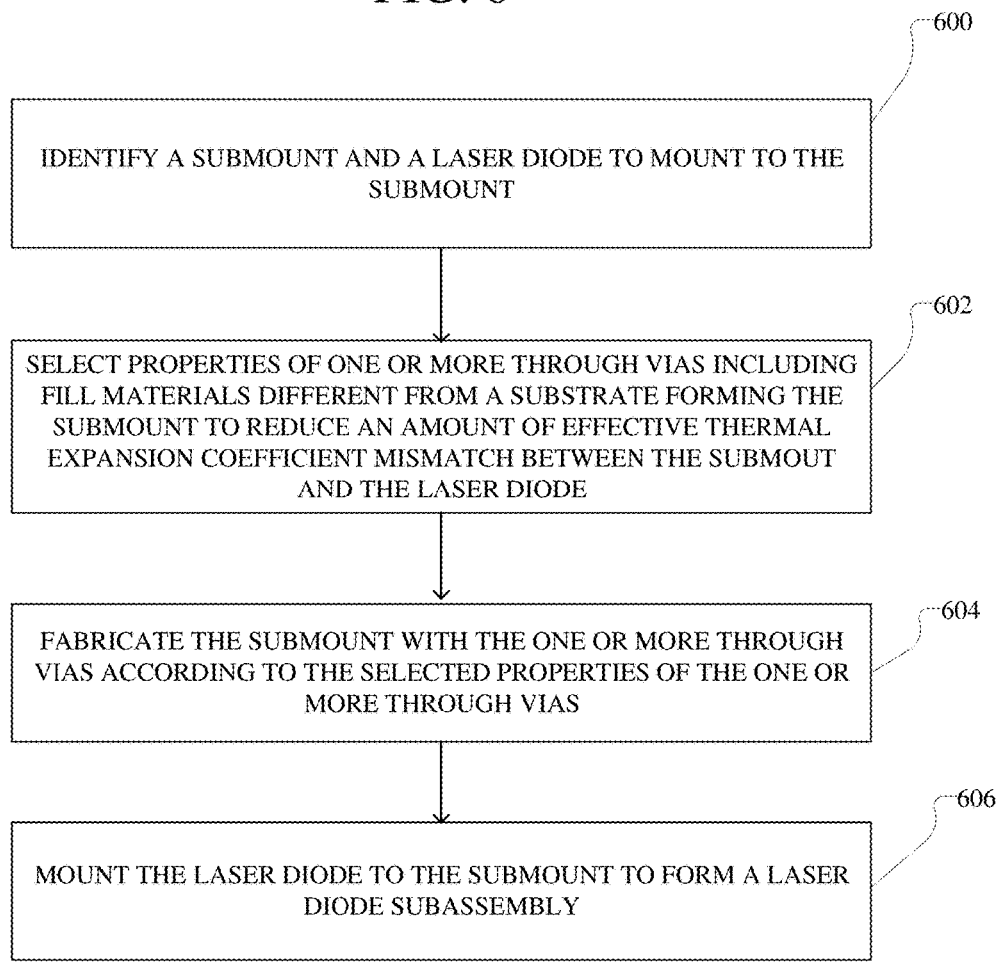
FIG. 6 illustrates a flowchart for an example method of manufacturing laser diode assemblies that reduces chances of introducing kink failure in the laser diodes.

FIG. 6 illustrates a flowchart for an example method of manufacturing laser diode assemblies that reduces chances of introducing kink failure in the laser diodes. The method shown in FIG. 6 is provided by way of example, as there are a variety of ways to carry out the method. Additionally, while the example method is illustrated with a particular order of blocks, those of ordinary skill in the art will appreciate that FIG. 6 and the blocks shown therein can be executed in any order and can include fewer or more blocks than illustrated. Additionally, each block shown in FIG. 6 can represent one or more steps, processes, methods or routines in the method.

At step 600, a submount and a laser diode to mount to the submount are identified. The laser diode can include an applicable laser diode manufactured from applicable materials. For example, the laser diode can be an InP laser diode. Further, the submount can be fabricated from an applicable substrate material, such as Silicon. In using a Silicon substrate material, the submount can be fabricated, e.g. with through holes, using widely adopted and readily available semiconductor processing equipment.

At step 602, properties of one or more through vias including fill materials different from a substrate forming the submount are selected. The properties of the one or more through vias can be selected to reduce an amount of effective thermal expansion coefficient mismatch between the submount and the laser diode. In turn, the one or more properties of the through vias can be selected to reduce an amount of bow introduced in the laser diode through mounting of the laser diode to the submount, thereby reducing a change of kink failure occurring in the laser diode. The properties of the one or more through vias can be selected through application of a finite element analysis model of an amount of bow in a laser diode as a function of an amount of mismatch between coefficients of thermal expansion of the diode and a submount.

At step, 604, the submount with the one or more through vias is fabricated according to the selected properties of the one or more through vias. More specifically, the one or more through vias can be added to the submount according to the selected properties of the one or more through vias, e.g. using applicable semiconductor processing techniques such as Silicon semiconductor processing techniques. Subsequently, the one or more through vias can be filled with one or more filler materials according to the selected properties of the one or more through vias, e.g. using applicable semiconductor processing techniques.

At step 606, the laser diode is mounted to the submount to form a laser diode subassembly. The laser diode can be mounted to the submount according to an applicable manufacturing processing for bonding a diode to a submount, such as the manufacturing processes described herein. For example an AuSn solder can be applied to the submount and the laser diode can be placed on the submount at points where the solder is disposed on the submount. Subsequently, the solder can be heated to 280° C. to melt the solder and the entire subassembly can be cooled down in order to solidify the solder and subsequently mount the laser diode to the submount.

Figure 7:
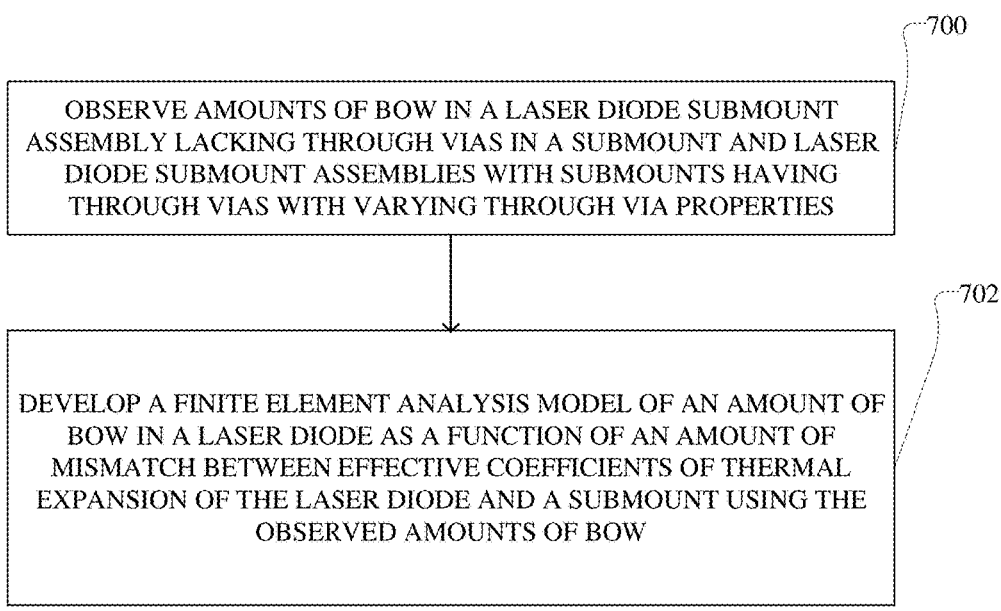
FIG. 7 illustrates a flowchart for an example method of developing a finite element analysis model used to reduce an amount of bow introduced in laser diodes of laser diode subassemblies through manufacturing of the subassemblies.
Figure 8:
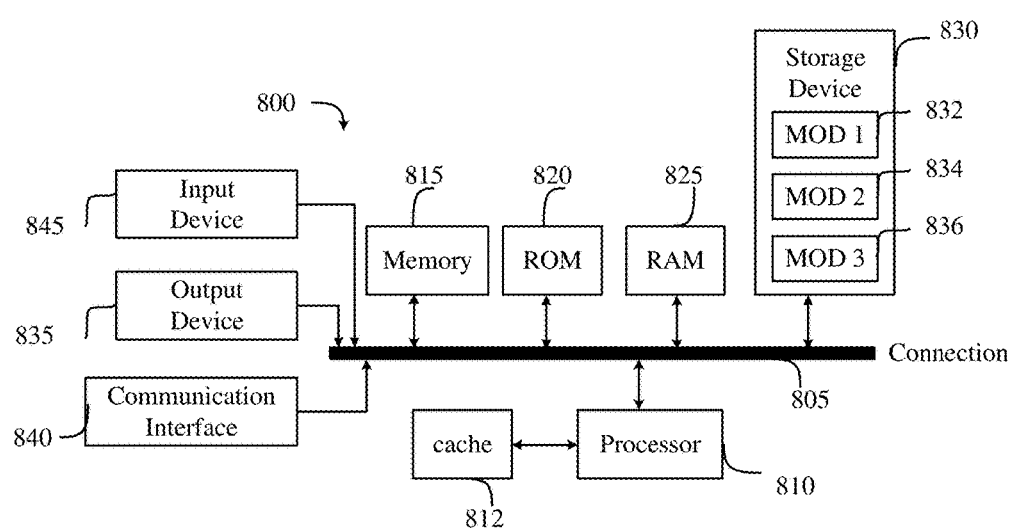
FIG. 8 illustrates an example computing device in accordance with various embodiments.

FIG. 7 illustrates a flowchart for an example method of developing a finite element analysis model used to reduce an amount of bow introduced in laser diodes of laser diode subassemblies through manufacturing of the subassemblies. The method shown in FIG. 7 is provided by way of example, as there are a variety of ways to carry out the method. Additionally, while the example method is illustrated with a particular order of blocks, those of ordinary skill in the art will appreciate that FIG. 7 and the blocks shown therein can be executed in any order and can include fewer or more blocks than illustrated. Additionally, each block shown in FIG. 7 can represent one or more steps, processes, methods or routines in the method.

At step 700, an amount of bow in a laser diode submount assembly lacking through vias in a submount of the assembly are observed. Further, at step 700, amounts of bow in laser diode submount assemblies with submounts having through vias with varying through via properties are observed. The amounts of bow observed in the laser diode assemblies can refer to an amount of bow in laser diodes of the laser diode assemblies. Further, the bow can be introduced to the laser diode assemblies during manufacturing the laser diode subassemblies. More specifically, the bow can be introduced in the laser diode assemblies as a result of mismatches between effective coefficients of thermal expansion of the laser diodes and the submounts in the laser diode submount assemblies.

At step 702, a finite element analysis model of an amount of bow in a laser diode as a function of an amount of mismatch between effective coefficients of thermal expansion of a laser diode and a submount can be developed using the observed bow. More specifically, the finite element analysis model can be developed based on the amount of bow observed in the submount assembly lacking through vias in the submount and the submount assemblies having through vias with varying through via properties in the submounts. The finite element analysis model can also be developed based on either or both properties of the laser diode and properties of a material used to bond the laser diode to a submount. For example, the finite element analysis model can be developed to account for bow based on dimensions of a laser diode. The finite element analysis model can be used to select via properties of one or more vias in a submount of a laser diode assembly for purposes of reducing an amount of mismatch between an effective coefficient of thermal expansion of the submount and an effective coefficient of thermal expansion of a laser diode in the assembly.

FIG. 8 illustrates a computing system architecture 800 wherein the components of the system are in electrical communication with each other using a connection 805, such as a bus. The computing system architecture 800 can be configured to select through via properties of one or more through vias in a submount for purposes of reducing an amount of mismatch between an effective coefficient of thermal expansion of a submount and an effective coefficient of thermal expansion of a laser diode in an assembly. Additionally, the computing system 800 can be used to develop a finite element analysis model, such as described in the flowchart shown in FIG. 7

Exemplary system 800 includes a processing unit (CPU or processor) 810 and a system connection 805 that couples various system components including the system memory 815, such as read only memory (ROM) 720 and random access memory (RAM) 825, to the processor 810. The system 800 can include a cache of high-speed memory connected directly with, in close proximity to, or integrated as part of the processor 810. The system 800 can copy data from the memory 815 and/or the storage device 830 to the cache 812 for quick access by the processor 810. In this way, the cache can provide a performance boost that avoids processor 810 delays while waiting for data. These and other modules can control or be configured to control the processor 810 to perform various actions. Other system memory 815 may be available for use as well. The memory 815 can include multiple different types of memory with different performance characteristics. The processor 810 can include any general purpose processor and a hardware or software service, such as service 1 832, service 2 834, and service 3 836 stored in storage device 830, configured to control the processor 810 as well as a special-purpose processor where software instructions are incorporated into the actual processor design. The processor 810 may be a completely self-contained computing system, containing multiple cores or processors, a bus, memory controller, cache, etc. A multi-core processor may be symmetric or asymmetric.

To enable user interaction with the computing device 800, an input device 845 can represent any number of input mechanisms, such as a microphone for speech, a touch-sensitive screen for gesture or graphical input, keyboard, mouse, motion input, speech and so forth. An output device 835 can also be one or more of a number of output mechanisms known to those of skill in the art. In some instances, multimodal systems can enable a user to provide multiple types of input to communicate with the computing device 800. The communications interface 840 can generally govern and manage the user input and system output. There is no restriction on operating on any particular hardware arrangement and therefore the basic features here may easily be substituted for improved hardware or firmware arrangements as they are developed.

Storage device 830 is a non-volatile memory and can be a hard disk or other types of computer readable media which can store data that are accessible by a computer, such as magnetic cassettes, flash memory cards, solid state memory devices, digital versatile disks, cartridges, random access memories (RAMs) 825, read only memory (ROM) 820, and hybrids thereof.

The storage device 830 can include services 832, 834, 836 for controlling the processor 810. Other hardware or software modules are contemplated. The storage device 830 can be connected to the system connection 805. In one aspect, a hardware module that performs a particular function can include the software component stored in a computer-readable medium in connection with the necessary hardware components, such as the processor 810, connection 805, output device 835, and so forth, to carry out the function.

For clarity of explanation, in some instances the present technology may be presented as including individual functional blocks including functional blocks comprising devices, device components, steps or routines in a method embodied in software, or combinations of hardware and software.

In some embodiments the computer-readable storage devices, mediums, and memories can include a cable or wireless signal containing a bit stream and the like. However, when mentioned, non-transitory computer-readable storage media expressly exclude media such as energy, carrier signals, electromagnetic waves, and signals per se.

Methods according to the above-described examples can be implemented using computer-executable instructions that are stored or otherwise available from computer readable media. Such instructions can comprise, for example, instructions and data which cause or otherwise configure a general purpose computer, special purpose computer, or special purpose processing device to perform a certain function or group of functions. Portions of computer resources used can be accessible over a network. The computer executable instructions may be, for example, binaries, intermediate format instructions such as assembly language, firmware, or source code. Examples of computer-readable media that may be used to store instructions, information used, and/or information created during methods according to described examples include magnetic or optical disks, flash memory, USB devices provided with non-volatile memory, networked storage devices, and so on.

Devices implementing methods according to these disclosures can comprise hardware, firmware and/or software, and can take any of a variety of form factors. Typical examples of such form factors include laptops, smart phones, small form factor personal computers, personal digital assistants, rackmount devices, standalone devices, and so on. Functionality described herein also can be embodied in peripherals or add-in cards. Such functionality can also be implemented on a circuit board among different chips or different processes executing in a single device, by way of further example.

The instructions, media for conveying such instructions, computing resources for executing them, and other structures for supporting such computing resources are means for providing the functions described in these disclosures.

Although a variety of examples and other information was used to explain aspects within the scope of the appended claims, no limitation of the claims should be implied based on particular features or arrangements in such examples, as one of ordinary skill would be able to use these examples to derive a wide variety of implementations. Further and although some subject matter may have been described in language specific to examples of structural features and/or method steps, it is to be understood that the subject matter defined in the appended claims is not necessarily limited to these described features or acts. For example, such functionality can be distributed differently or performed in components other than those identified herein. Rather, the described features and steps are disclosed as examples of components of systems and methods within the scope of the appended claims.

Claim language reciting "at least one of" refers to at least one of a set and indicates that one member of the set or multiple members of the set satisfy the claim. For example, claim language reciting "at least one of A and B" means A, B, or A and B.

What is claimed is:

1. A laser diode device comprising:
   one or more laser diodes configured to emit electromagnetic radiation coherently; and
   one or more submounts upon which the one or more laser diodes are mounted, the one or more submounts including one or more through vias including one or more fill materials different from a material of the one or more submounts, one or more properties of the one or more through vias in the one or more submounts selected to reduce an amount of mismatch between an effective coefficient of thermal expansion of the one or more laser diodes and an effective coefficient of thermal expansion of the one or more submounts.

2. The laser diode device of claim 1, wherein reducing the amount of mismatch between the effective coefficient of thermal expansion of the one or more laser diodes and the effective coefficient of thermal expansion of the one or more submounts reduces an amount of bow in the one or more laser diodes caused by a process of cooling down the one or more laser diodes and the one or more submounts after bonding the one or more laser diodes onto the one or more submounts.

3. The laser diode device of claim 2, wherein reducing the amount of bow in the one or more laser diodes reduces a chance of kink failure in the one or more laser diodes corresponding to distortions in gratings of the one or more laser diodes caused by the amount of bow in the one or more laser diodes.

4. The laser diode device of claim 1, wherein the one or more properties of the one or more through vias include at least one of a number of the one or more through vias, dimensions of the one or more through vias, a density of the one or more through vias in a volume of the one or more submounts, and the one or more fill materials of the one or more through vias.

5. The laser diode device of claim 1, wherein the one or more fill materials of the one or more through vias have a coefficient of thermal expansion greater than a coefficient of thermal expansion of the material of the one or more submounts to increase the effective coefficient of thermal expansion of the one or more submounts.

6. The laser diode device of claim 1, wherein the one or more fill materials include Copper.

7. The laser diode device of claim 1, wherein the one or more submounts are fabricated from Silicon.

8. The laser diode device of claim 1, wherein the one or more properties of the one or more through vias include positions of the one or more through vias in the one or more submounts with respect to positions of the one or more laser diodes mounted to the one or more submounts.

9. The laser diode device of claim 1, wherein the one or more through vias are disposed in the one or more submounts throughout an entire volume of the one or more submounts.

10. The laser diode device of claim 1, wherein the one or more through vias are selectively disposed in the one or more submounts in one or more stage areas corresponding to positions of the one or more laser diodes mounted to the one or more submounts.

11. The laser diode device of claim 1, wherein the one or more properties of the one or more through vias are selected based on dimensions of the one or more laser diodes.

12. The laser diode device of claim 1, wherein the one or more properties of the one or more through vias are selected based on one or more materials used to attach the one or more laser diodes to the one or more submounts as part of mounting the one or more laser diodes to the one or more submounts.

13. The laser diode device of claim 1, wherein the one or more properties of the one or more through vias are selected through a finite element analysis model of an amount of bow in a laser diode as a function of an amount of mismatch between effective coefficients of thermal expansion of the laser diode and a submount, the model created based on amounts of bow observed in a laser diode submount assembly lacking through vias in the submount of the laser diode submount assembly and laser diode submount assemblies with submounts including through vias with fill materials having varying through via properties.

14. A method comprising:
  identifying one or more submounts and one or more laser diodes to mount to the one or more submounts;
  selecting one or more properties of one or more through vias including one or more fill materials different from a material of the one or more submounts, the one or more properties of the one or more through vias including the one or more fill materials selected to reduce an amount of mismatch between an effective coefficient of thermal expansion of the one or more laser diodes and an effective coefficient of thermal expansion of the one or more submounts;
  fabricating the one or more submounts according to the one or more properties of the one or more through vias including the one or more fill materials selected to reduce the amount of mismatch between the effective coefficient of thermal expansion of the one or more laser diodes and the effective coefficient of thermal expansion of the one or more submounts; and
  mounting the one or more laser diodes to the one or more submounts.

15. The method of claim 14, wherein reducing the amount of mismatch between the effective coefficient of thermal expansion of the one or more laser diodes and the effective coefficient of thermal expansion of the one or more submounts reduces an amount of bow in the one or more laser diodes caused by a process of cooling down the one or more laser diodes and the one or more submounts after bonding the one or more laser diodes onto the one or more submounts.

16. The method of claim 15, wherein reducing the amount of bow in the one or more laser diodes reduces a chance of kink failure in the one or more laser diodes corresponding to distortions in gratings of the one or more laser diodes caused by the amount of bow in the one or more laser diodes.

17. The method of claim 14, wherein the one or more properties of the one or more through vias include at least one of a number of the one or more through vias, dimensions of the one or more through vias, a density of the one or more through vias in a volume of the one or more submounts, and the one or more fill materials of the one or more through vias.

18. The method of claim 14, wherein the one or more fill materials of the one or more through vias have a coefficient of thermal expansion greater than a coefficient of thermal expansion of the material of the one or more submounts to increase the effective coefficient of thermal expansion of the one or more submounts.

19. The method of claim 14, wherein the one or more properties of the one or more through vias include positions of the one or more through vias in the one or more submounts with respect to positions of the one or more laser diodes mounted to the one or more submounts.

* * * * *